(12) United States Patent
Anderson et al.

(10) Patent No.: US 8,210,120 B2
(45) Date of Patent: Jul. 3, 2012

(54) SYSTEMS AND METHODS FOR BUILDING TAMPER RESISTANT COATINGS

(75) Inventors: Curtis W. Anderson, Cedar Rapids, IA (US); Thomas W. Dowland, Fountain Valley, CA (US); Leonard W. Reeves, Gilbert, AZ (US); Bjarne Heggli, Scottsdale, AZ (US)

(73) Assignee: Microsemi Corporation, Irvine, CA (US)

( * ) Notice: Subject to any disclaimer, the term of this patent is extended or adjusted under 35 U.S.C. 154(b) by 1722 days.

(21) Appl. No.: 10/941,628

(22) Filed: Sep. 14, 2004

(65) Prior Publication Data

US 2005/0284366 A1 Dec. 29, 2005

Related U.S. Application Data

(63) Continuation-in-part of application No. 10/339,800, filed on Jan. 10, 2003, now Pat. No. 7,208,046.

(51) Int. Cl.
*B05B 7/16* (2006.01)
*C23C 16/52* (2006.01)

(52) U.S. Cl. .......................... 118/302; 427/8

(58) Field of Classification Search .................. 118/302, 118/321, 320, 323, 666–667; 427/446, 8
See application file for complete search history.

(56) References Cited

U.S. PATENT DOCUMENTS

| | | | |
|---|---|---|---|
| 4,505,945 A * | 3/1985 | Dubust et al. ............... | 427/8 |
| 5,127,362 A * | 7/1992 | Iwatsu et al. ................ | 118/667 |
| 5,258,334 A | 11/1993 | Lantz, II | |
| 5,397,897 A * | 3/1995 | Komatsu et al. ........... | 250/338.4 |
| 5,399,441 A | 3/1995 | Bearinger et al. | |
| 5,411,588 A * | 5/1995 | Diepens et al. ............. | 118/666 |
| 5,762,711 A | 6/1998 | Heffner et al. | |
| 5,877,093 A | 3/1999 | Heffner et al. | |
| 5,920,112 A | 7/1999 | Datri et al. | |
| 5,932,009 A * | 8/1999 | Kim et al. ................... | 118/52 |
| 6,025,012 A * | 2/2000 | Matsuda et al. ............ | 427/9 |
| 6,110,537 A | 8/2000 | Heffner et al. | |
| 6,159,869 A | 12/2000 | Datri et al. | |
| 6,300,162 B1 | 10/2001 | Shiel et al. | |
| 6,306,455 B1 * | 10/2001 | Takamori et al. ........... | 427/8 |
| 6,308,776 B1 * | 10/2001 | Sloan et al. ................ | 165/206 |
| 6,319,740 B1 | 11/2001 | Heffner et al. | |
| 6,322,626 B1 * | 11/2001 | Shirley ........................ | 118/73 |
| 6,436,472 B1 * | 8/2002 | Sago et al. .................. | 427/240 |
| 6,592,707 B2 * | 7/2003 | Shih et al. .................. | 156/345.1 |
| 6,662,466 B2 * | 12/2003 | Gurer et al. ................ | 34/317 |
| 2001/0033012 A1 | 10/2001 | Kommerling et al. | |

OTHER PUBLICATIONS

"Evaluate Techniques to Measure, Understand, and Control MCM Temperature During Powder Denosition," Jul. 15, 2002.

* cited by examiner

*Primary Examiner* — Dah-Wei Yuan
*Assistant Examiner* — Charles Capozzi
(74) *Attorney, Agent, or Firm* — Allen J. Moss; Squire Sanders (US) LLP

(57) ABSTRACT

A system for building a TRC includes a spray mechanism for spraying a coating material, a target system including a rotatable spray-target that retains an object with a surface to be covered by the TRC, a temperature sensor, and a control system for controlling application of the coating material based on a temperature that is determined during the spraying. The temperature sensor may comprise a non-contact infrared sensor that may measure a temperature related to the object. The measured temperature may be controlled by varying the speed of the rotatable spray-target.

20 Claims, 15 Drawing Sheets

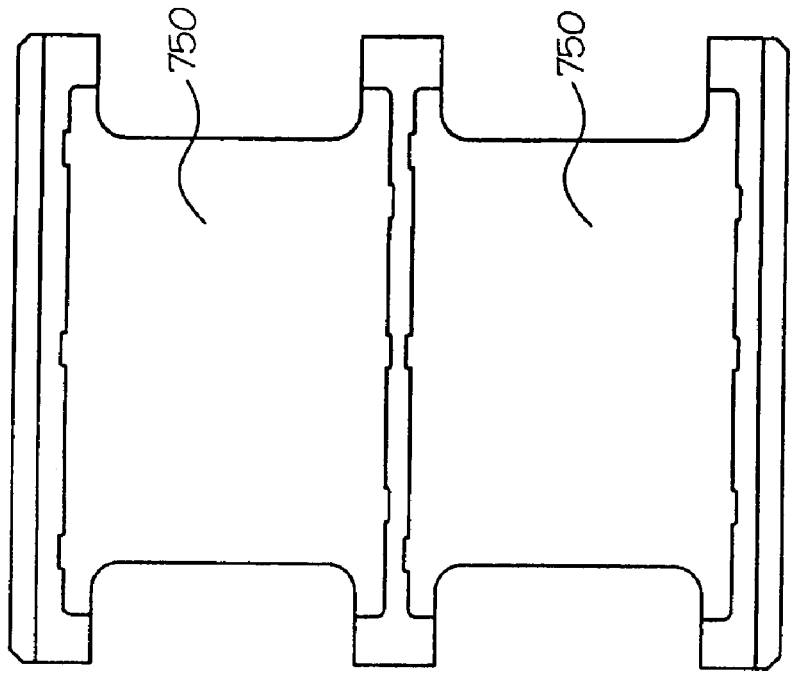
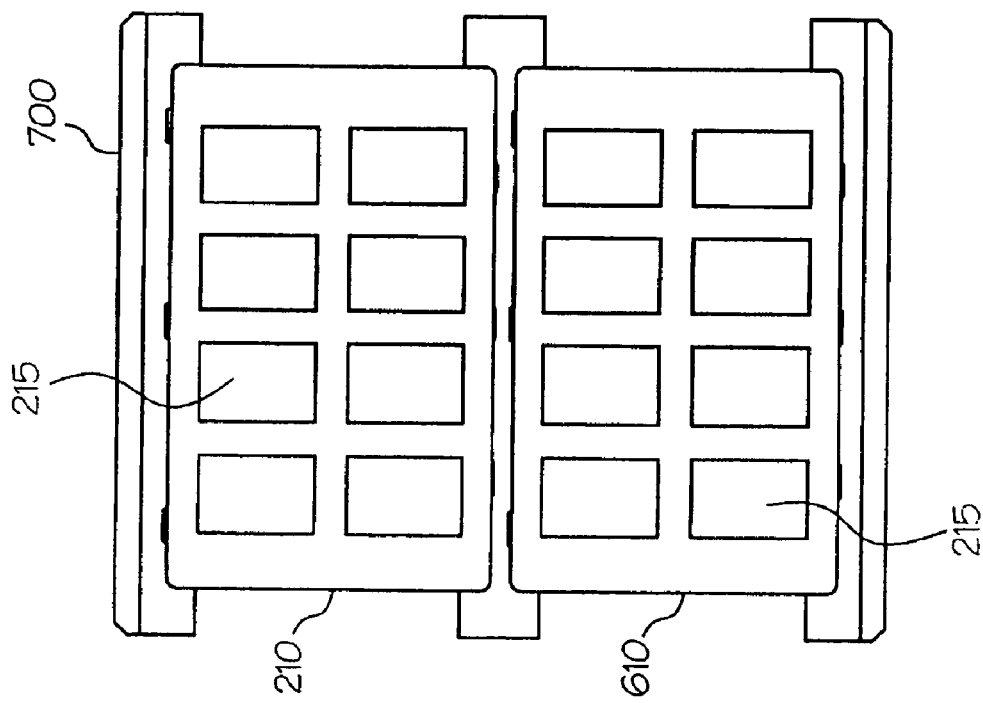
Fig. 7B
Fig. 7A

SYSTEMS AND METHODS FOR BUILDING TAMPER RESISTANT COATINGS

RELATED APPLICATION

This application claims priority to, and is a continuation-in-part of, U.S. application Ser. No. 10/339,800, filed Jan. 10, 2003 now U.S. Pat. No. 7,208,046, by inventors Curtis W. Anderson, Thomas W. Dowland, Leonard W. Reeves, and Bjarne Heggli, and which is incorporated herein by reference.

BACKGROUND OF THE INVENTION

1. Technical Field

The present invention is related to systems and methods for coating objects, and, more particularly, to systems and methods for building tamper resistant coatings on objects.

2. Background Art

There are many applications in which it is desired to apply a coating to a part or form a product layer using a spray process. Such applications may include applying primers, paints, and/or other types of coatings. Once such coating for which the present invention may be used, but is not limited to, is the application of a tamper resistant coating (TRC). A TRC is a layer applied to a product to provide a physical barrier to prevent inspection of, and tampering with, for example, the underlying circuitry and contents of electronic components.

Processes and systems for coating electronic circuits with protective coatings and security coatings using a thermal spray are generally known. Examples of such processes are described in U.S. Pat. Nos. 5,877,093; 6,110,537; 5,762,711; and 6,319,740 all to Heffner et al. Application of TRCs by heating a material to a molten state and spraying the molten material where desired is generally referred to herein as a "thermal-spray process," a "thermal spray" or "thermal spraying."

FIG. 1 illustrates a thermal-spray system disclosed by U.S. Pat. No. 6,110,537 to Heffner et al., which is incorporated herein by its reference. Particles of a coating material 60 are supplied from a feedstock supply to a thermal-spray gun 31. Fuel and oxygen are supplied to gun 31 to heat the coating material 60 to a molten state. Air 66 is combined with the stream of molten particles and output through flame front 67 toward one or more parts or circuits mounted on arms 68. During the thermal-spray process, arms 68 are rotated by motor 70. A coolant 74 may be pumped through the interior of arms 68 to regulate temperatures during the thermal-spray process.

Arms 68 rotate in the range of approximately one thousand revolutions per minute to repetitively sweep parts or circuits, e.g., attached at ends of arms 68, through the flame spray. With each pass, a layer of coating builds up on the exposed surface of an integrated circuit.

As shown in FIG. 2, U.S. Pat. No. 6,110,537 to Heffner et al. also discloses an embodiment wherein in lieu of arms 68, multiple integrated circuits 13 may be clamped in an aluminum disk fixture including disk 88 and mask 90 to a stand 92 having alignment pins 92a. Integrated circuits 13 are inserted and individually clamped in place by screws (not shown) that are inserted in holes 88b and 90b. Like arm 68 disk 88 contains internal coolant outlets 91 that connect with internal coolant passages 91a. The disk disclosed by Heffner et al. enables thermal-spray processing of multiple ICs, but requires a person to individually insert each circuit 13 in the disk before performing the thermal-spray process. Furthermore, each circuit must be individually removed from the disk by hand before further processing can be performed, if any is required.

The disk approach disclosed by Heffner et al. has subsequently evolved into the use of larger wheels and device-holding structures mounted thereto. With a larger wheel, a plurality of device-holding fixtures can be mounted and processed. Further, spray guns mounted on movable arms were incorporated to cover the increasing spray area on the larger spray-target wheels.

A shortcoming of such prior-art thermal-spray systems is that they do not produce a consistent TRC-deposition rate. An inconsistent TRC-deposition rate may unpredictably affect the porosity percentage and/or the total pore volume in a TRC-coating. This may make it difficult for any subsequent processing that must accurately account for porosity percentage and/or total pore volume. An inconsistent TRC-deposition rate may also unpredictably affect the deposited mass of a TRC-coating, which is problematic for mass-sensitive applications. Another problem that may result from an inconsistent TRC-deposition rate is that it may unpredictably affect the height of the completed TRC coating, and therefore, the height of the resulting integrated circuit package, for example, which is problematic for height-sensitive applications.

An inconsistent TRC-deposition rate may result from uncontrolled variation in any one of a number of different thermal-spray factors. One such factor is the temperature of the objects-under-process, such as integrated circuits. Thus, it is desirable to control the temperature of the objects during thermal spraying. This concern is not addressed by the prior art.

Instead, the following is generally done today. A number of practice runs are performed to establish an optimum set of thermal-spraying conditions, such as the torch settings, the speed to move the objects-under-process and the like. Then, thermal spraying is performed using the previously-determined optimum set of thermal-spraying conditions. The problem with this approach is that it does not take into account variations that may occur during thermal spraying from day to day, or even moment to moment. For example, as ambient temperature or a torch setting may drift over time, temperature of the objects-under-process may change. This may produce inconsistent TRC-deposition rates, and therefore, there is a need to control temperature of the objects-under-process.

BRIEF SUMMARY OF THE INVENTION

In accordance with an embodiment of the invention, a method is disclosed for building a TRC, comprising applying a coating material over a surface to build the TRC, and controlling the applying based on a temperature that is determined during the applying of the coating material.

In accordance with another embodiment of the invention, a system is disclosed for building a TRC, comprising a spray mechanism for spraying a coating material, a target system including a rotatable spray-target that retains an object with a surface to be covered by the TRC, a temperature sensor, and a control system for controlling application of the coating material based on a temperature that is determined during the spraying.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE SEVERAL VIEWS OF THE DRAWING

Further aspects, features and advantages of the present invention will become apparent from the following description of the invention in reference to the appended drawings in which like numerals denote like elements and in which:

FIGS. 7A-7B illustrate a device-holding fixture processing tray for use in a spray-coating process according to an embodiment of the present invention;

DETAILED DESCRIPTION OF THE INVENTION

Figure 1:
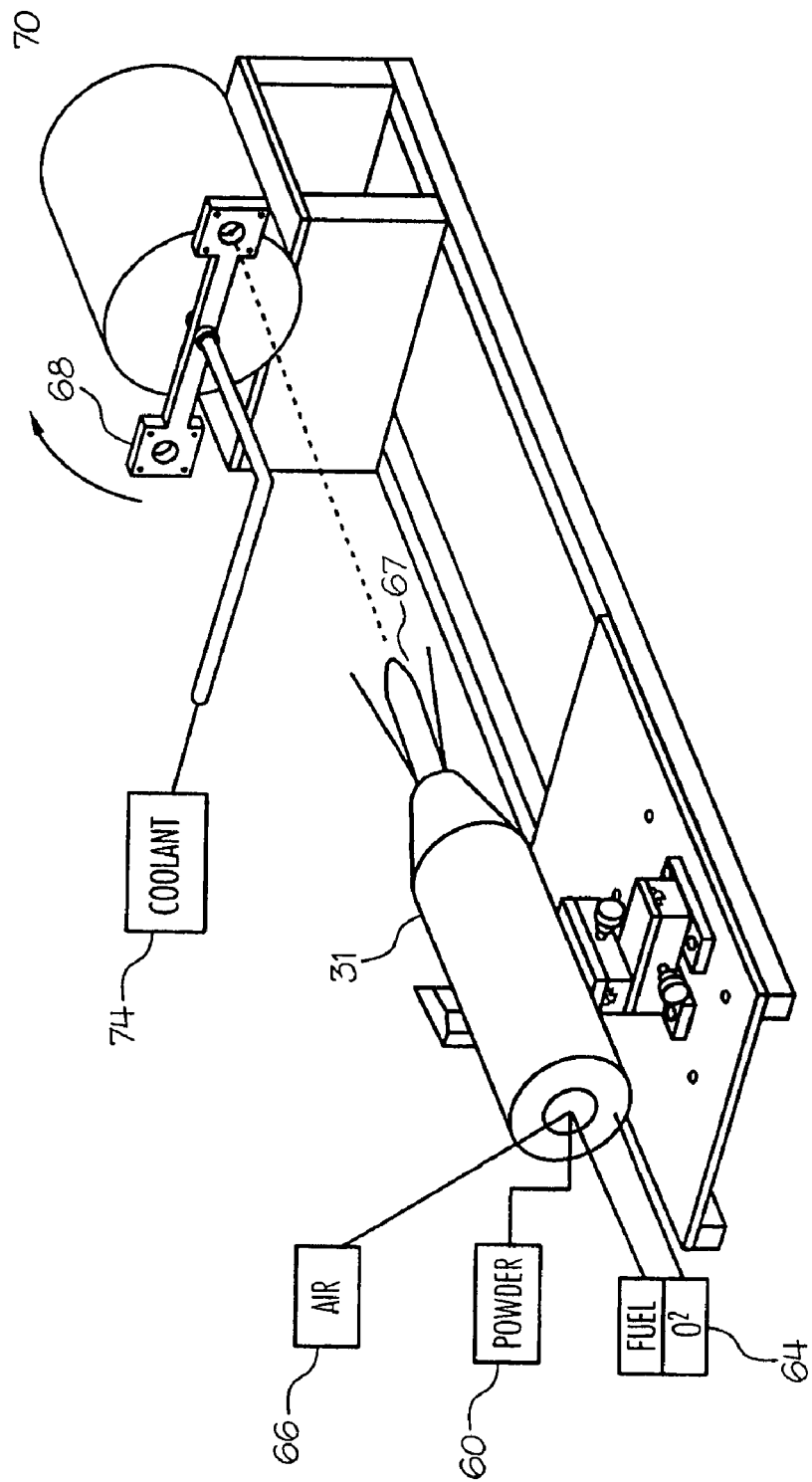
FIG. 1 is a thermal-spray system of the prior art.
Figure 2:
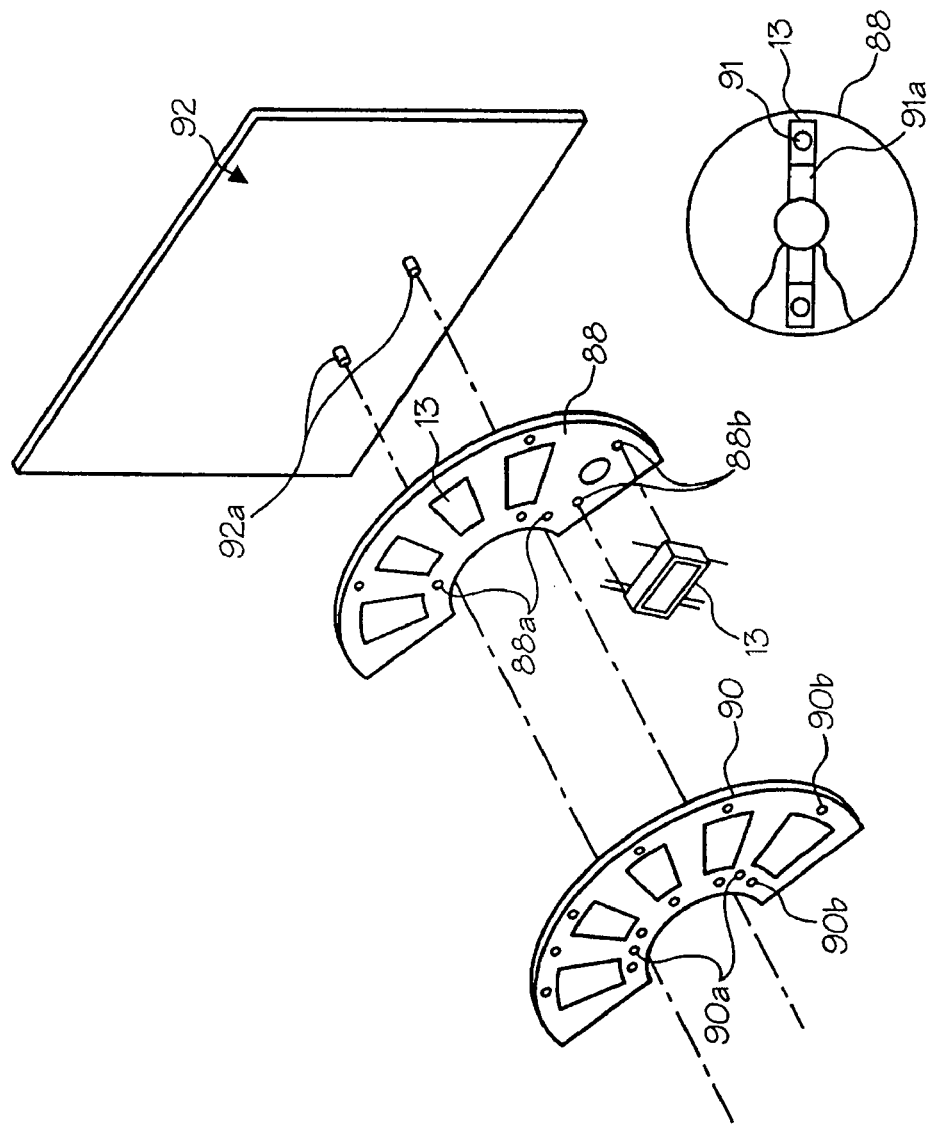
FIG. 2 is a modified thermal-spray system of the prior art.
Figure 3A:
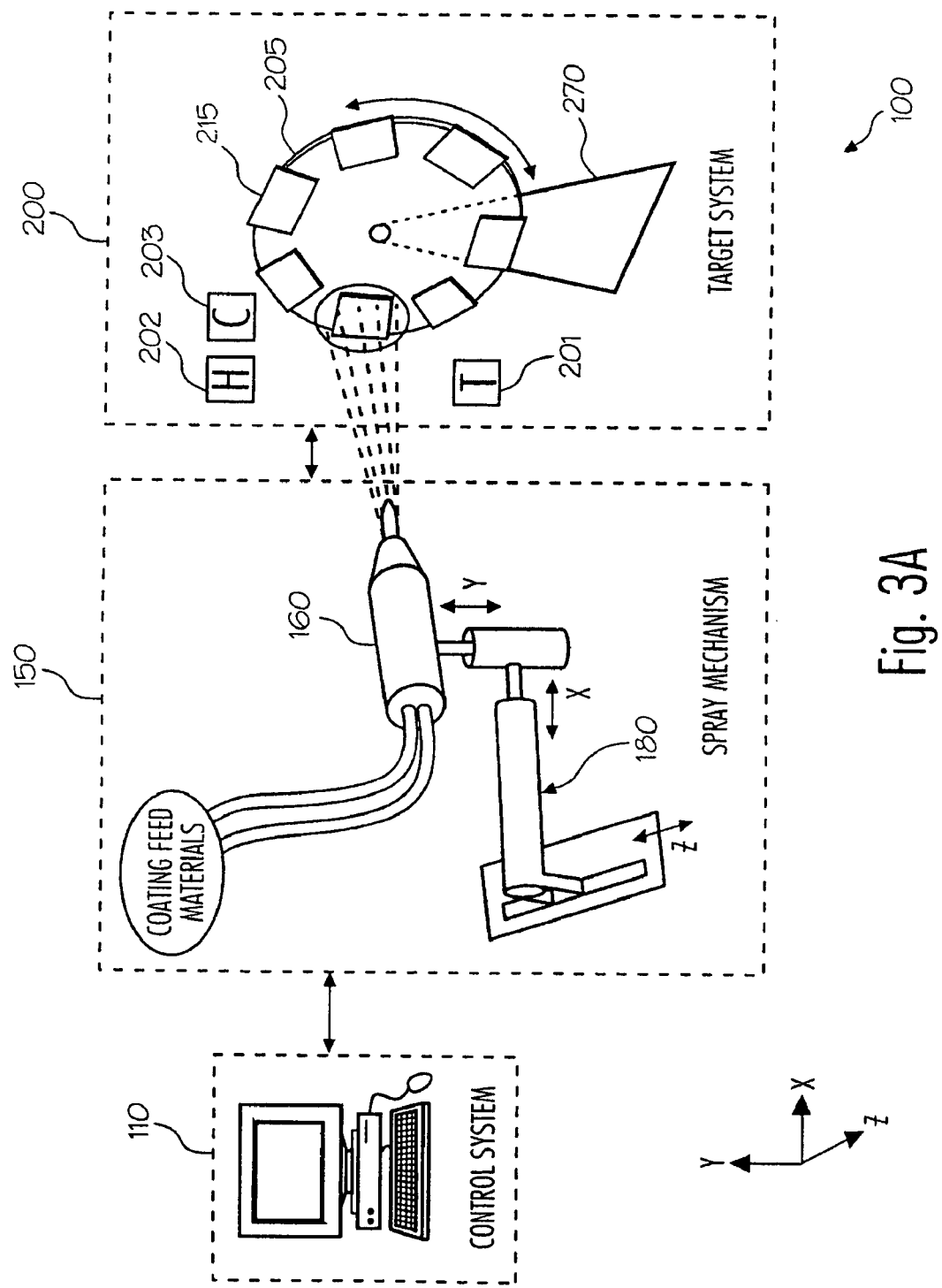
FIGS. 3A-3E illustrate a spray-coating system and various components according to an embodiment of the present invention.

Turning to FIG. 3A, a coating system 100 for spray-coating parts, according to one aspect of the invention includes a spray-coating control system 110, a spray-coating mechanism 150, and a spray-target system 200.

Spray mechanism 150 functions to spray a coating material 1006 (see FIG. 11) towards target system 200 to coat one or more devices with a coating. Spray mechanism 150 may be any device or combination of devices for accomplishing this function. In preferred embodiments of the present invention, spray mechanism 150 comprises a thermal-spray gun 160 similar to that disclosed by Heffner et al., and a spray-gun mounting system 180. However, there is nothing herein that limits the present invention to thermal-spray processes.

In the most preferred embodiments of the present invention, unlike the thermal-spray system disclosed by Heffner et al., mounting system 180 is configured to be able to electrically, mechanically, and/or hydraulically move gun 160 in one or more directions. As shown by the example in FIG. 3A, spray gun 160 is mounted on mounting system 180 which may control the movement of gun 160 along any of the X, Y and/or Z axes for directing a spray of coating material 1006 toward target system 200. Mounting system 180 may further be configured to rotate spray gun 160 about the Y axis and/or angle gun 160 up or down from the X axis if desired. Mounting system 180 may be any device or combination of devices suitable for these functions including one or more arms controlled by electric servos, hydraulic pumps, or mechanical gears.

Preferably, although not required, movement of mounting system 180 and/or the coating parameters of spray gun 160 are controlled using a computerized control system 110. Computerized control system 110 functions to convert user-defined instructions into electrical signals for controlling various components of system 100 and may be any device or combination of devices for accomplishing this function including one or more computers, microprocessors, microcontrollers, programmable logic devices, and associated memories, cabling and/or peripheral components.

In preferred embodiments of the invention, control system 110 utilizes one or more computer programs to enable a user to set, maintain and/or adjust one or more coating parameters for coating parts. Such coating parameters may include, among others, the amount of coating material 1006 fed to and/or sprayed by gun 160, distance of gun 160 from target 200, movement of gun 160 during a coating run, revolutions per minute of target system 200, length of time for the spray processes, and, if a flame-spray process, the mixture of the torch gases, temperature of sprayed coating, temperature of spray environment, and other user-desired variations in spray coating.

Additionally, when a coating run for a particular product has already been designed, tested and accepted, the specific parameters used for applying that coating may be coded into machine-readable code for access by control system 110 to duplicate previously-completed spray processes. This aspect of the present invention, along with others described herein, assists in facilitating repeatable batch processing of coated parts that consistently meet quality control standards.

Spray-coating target system 200 serves to pass parts or products 215 through an airborne stream of coating material 1006 provided by spray mechanism 150. Target system 200 may be any device or combination of devices for accomplishing this purpose. In certain preferred embodiments, as described in further detail hereinafter, target system 200 includes a coating target-wheel 205 rotatably mounted to a target-wheel support-structure 270. Parts or products 215 are attached to target-wheel 205 and as target wheel 205 rotates about its axis, parts 215 are passed through coating material 1006.

Target wheel 205 and wheel support structure 270 may be any device or devices capable of accomplishing the foregoing functions. Notably, wheel support structure 270 may or may not include one or more electrically or mechanically motorized elements (not shown) for turning wheel 205, or alternatively, wheel 205 may be turned by a winding mechanism or by hand.

Figure 3B:
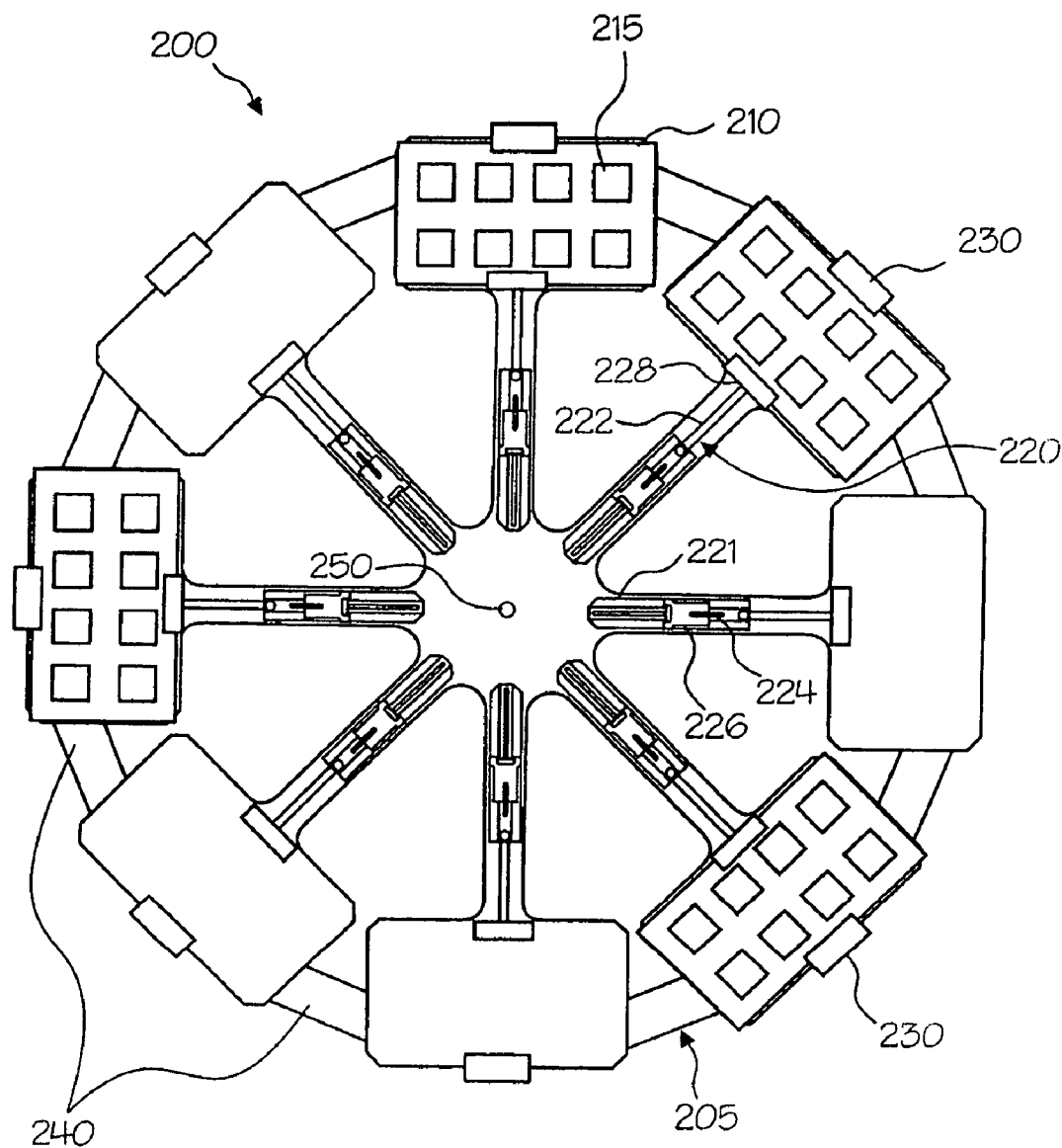

Turning to FIG. 3B, the target system 200 of the preferred embodiments includes means for rapid attachment and detachment of parts 215 to wheel 205. In one embodiment of the present invention, multiple parts 215 are loaded into a cassette fixture 210 (also referred to herein as part-holding fixtures or device-holding fixtures) for spray coating. Multiple cassette fixtures 210 may then be temporarily fixed to wheel 205, preferably without the requirement of any unattached threaded fasteners or locking pins.

In one embodiment of the present invention, wheel 205 includes a spring-tensioned fixture clamping assembly 220 for rapid fixing and removal of parts 215 to/from wheel 205. Clamping assembly 220 may be any single device or combination of devices attachable to, and/or formed in, wheel 205 that is capable of achieving these functions.

Figure 3C:
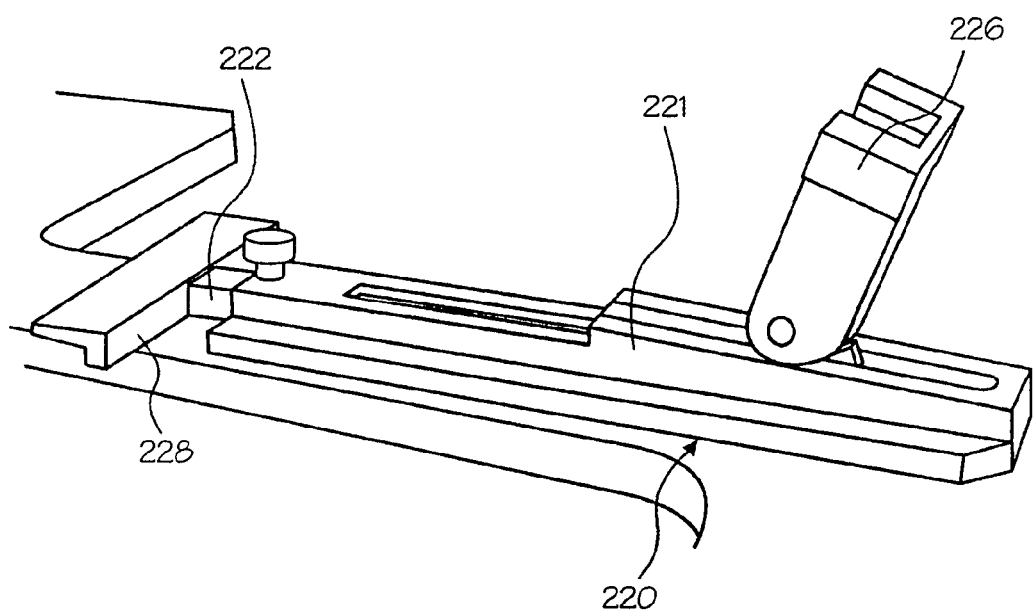
Figure 3D:
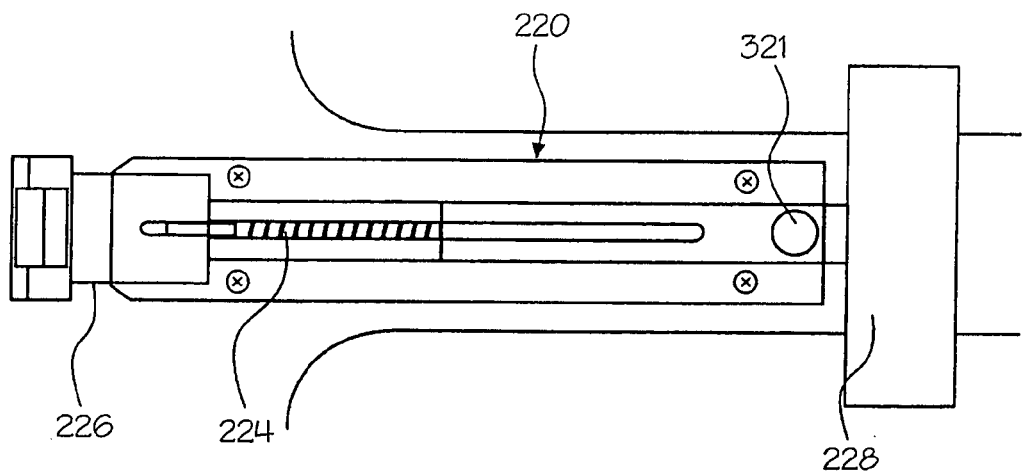
Figure 3E:
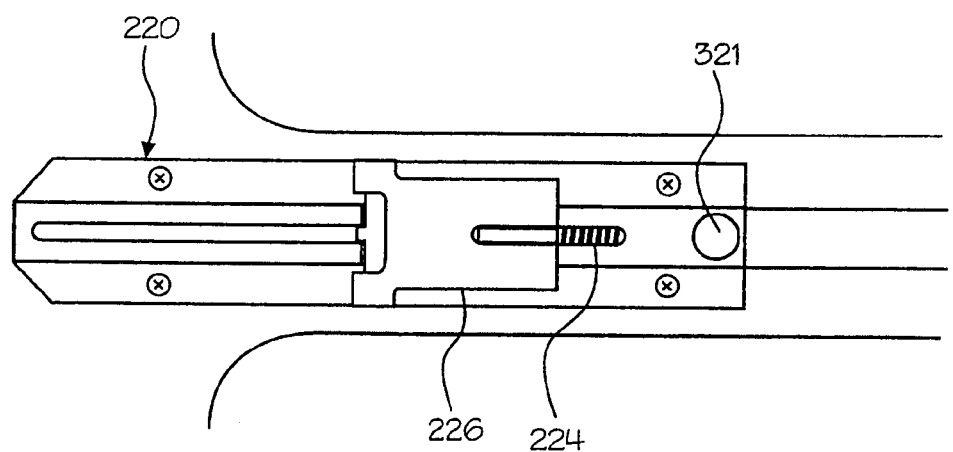

Referring also to FIGS. 3C-3E, in certain embodiments, clamping assembly 220 includes base 221, push rod 222, spring mechanism 224 and tension clamp 226. Assembly 220 may also include a clamp guide/mount 228 attached to a distal end of push rod 222.

Tension clamp 226 is preferably hingedly mounted to base 221 to have a first open position (FIGS. 3C-D) and a second locked position (FIG. 3E). In the second locked position, tension clamp 226 asserts spring force on push rod 222 (using spring mechanism 224) to bias the push rod 222, and hence clamp guide/mount 228, radially outward toward a guide/mount 230 fixed to an outer periphery of wheel 205. When tension claim 226 is in the locked position, the spring tension provided by spring mechanism 224, applies pressure to hold a part 215 and/or part-holding fixture 210 between clamp guide/mount 228 and fixed guide/mount 230. When tension clamp 226 is released into the first open position, push rod 222 and hence clamp guide/mount 228 is retracted radially inward to release any part 215 or part-holding fixture 210 between clamp guide/mount 228 and fixed guide/mount 230. An optional thumbscrew 321 may be included in assembly 220 so that when tightened, it prevents push rod 222 from prematurely retracting until unloading parts and fixtures and/or to minimize rod vibration during rotation of wheel 205.

Target system 200 may further include a temperature-monitoring ring so that device temperature can be monitored using one or more temperature sensors 201 (hereafter "temperature sensor 201"). In a preferred embodiment for a flame-spray process, a plurality of part-holding fixtures 210 are loaded into respective spaces on wheel 205. Between each fixture is a raised inter-fixture guide 240 to assist in maintaining exact placement of fixtures 210 on wheel 205. Inter-fixture guides 240 are preferably configured to have surfaces that are flush with, or slightly raised above, surfaces of fixtures 210 mounted on wheel 205. Most preferably, guide 240 is configured with a slightly beveled overhand that assists in clamping fixtures 210 to wheel 205. The top surfaces of guides 240 and fixtures 210 form a continuous ring on the surface of wheel 205 for which temperatures of part surfaces, e.g., substrates of parts 215, can be accurately monitored using temperature sensor 201. Process adjustments may be made during the deposition process based on the temperature (110; FIG. 3A).

System 200 further preferably includes a spray-gun self-centering mechanism 250 to enable repeatable spray-coating patterns. An important parameter of a spray-coating process, and particularly a thermal-spray process, is alignment of the spray gun or torch (160; FIG. 3A) to the wheel 205. Proper standoff distance, for example, may be critical to a successful coating operation.

In one embodiment, a gun self-centering mechanism 250 includes a hole located at an axial center point of wheel, a spring clip provided therein and a center spring held by the spring clip. Self-centering mechanism 250 may be used to verify that the torch is properly aligned before each coating operation commences.

Figure 4:
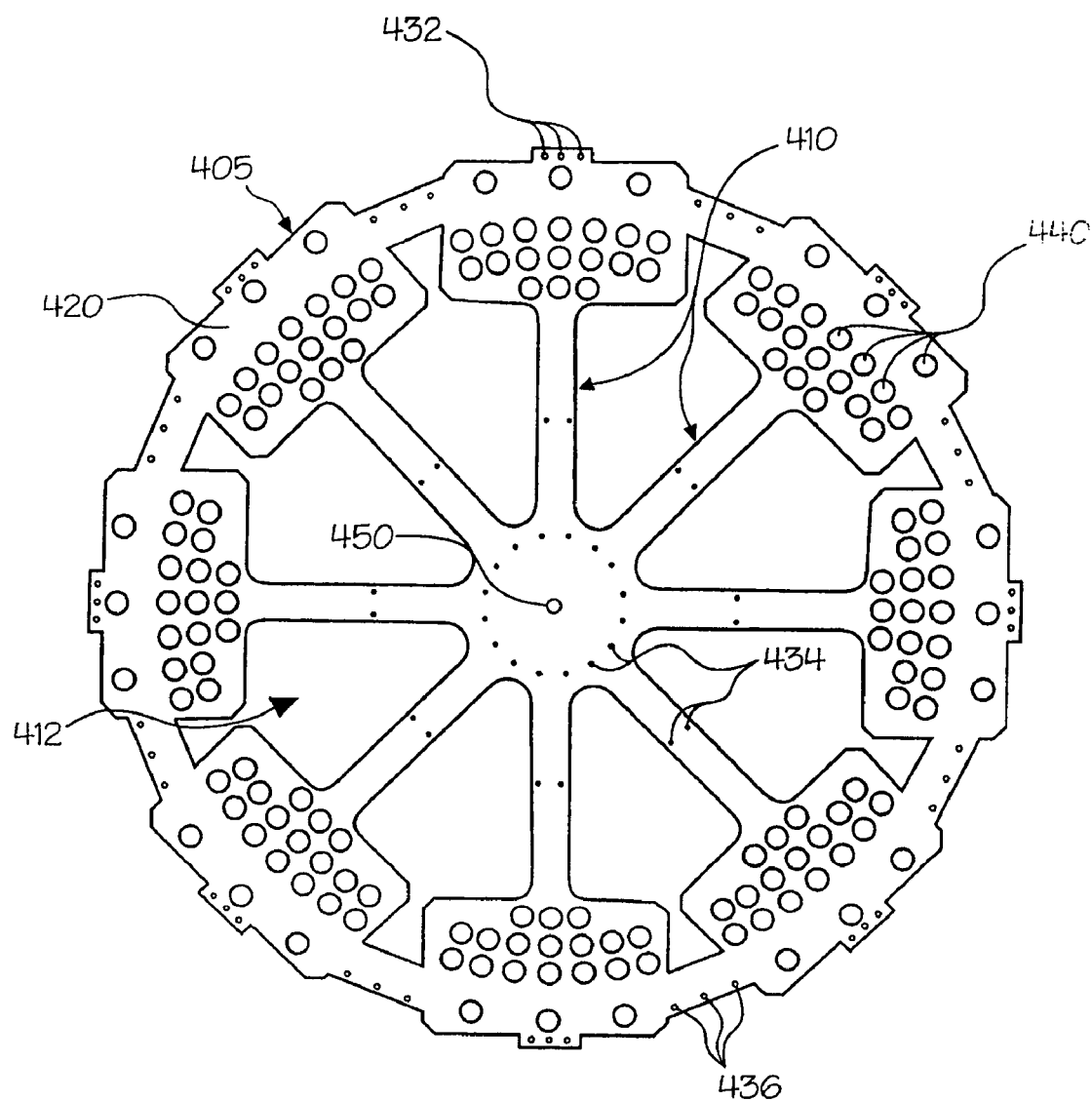
FIG. 4 illustrates a spray-coating wheel in accordance with an embodiment of the present invention.

Turning to FIG. 4, an exemplary embodiment of a spray-target wheel 405 includes a plurality of alternating radial arms 410 and radial openings 412. At an end of each radial arm 410 is a part or fixture backing surface 420. Radial arms 410 also preferably include a plurality of fixed guide-mounting elements 432, clamping assembly mounting elements 434 and inter-fixture guide-mounting elements 436. Mounting elements 432, 434 and 436 may be any configuration for mounting the respective items to wheel 205 including, by way of example, through holes, threaded holes, protruding pins, threaded fasteners and/or any combination thereof.

Radial openings 412 and voids 440 were selectively implemented into wheel 405 to reduce the overall weight of the wheel to improve handling and assembly of wheel 405. Moreover, reducing the mass of wheel 405 improves the overall target system 200 rotational and/or braking efficiency as well as the heat dissipation characteristics of wheel 405. To this end, mass-reducing holes are preferably implemented in as many areas of wheel 405 as possible without detracting from the structural integrity of wheel 405.

Wheel 405 is also designed with manufacturing ease in mind. The basic framework, as depicted by the example embodiment shown in FIG. 4, of wheel 405 may be machined from a flat stock material. In a preferred embodiment, wheel 405 is machined from an aluminum plate material. Accordingly, support structures for holding-device fixtures 210, etc., may be machined separately and attached to the main framework using screws or other types of fasteners. This is a significant improvement over conventional target-wheel designs in which these structures were included in a one-piece design. Furthermore, these separate parts are easily replaceable when needed, as opposed to the time and expense incurred for requiring another entire wheel or fixing the same.

Wheel 405 also preferably includes a hole 450 for accommodating self-centering mechanism 250 (FIG. 3B). Wheel 405 is preferably designed to best accommodate device-holding fixtures 210 (FIG. 3B) rather than a design where device-holding fixtures were designed only after a wheel has been designed. For example, the outer diameter of the wheel is optimally selected to fit a selected number of device fixtures toward the outer radius of wheel 405. This design is preferably optimized for thermal management in a thermal-spray-coating process, e.g., facilitates a spray area large enough that coating application (or deposition) can be conducted without the need for forced cooling, but small enough that device-substrate temperatures may be kept uniform, that is, there is no significant difference in temperature between the inner spray arc and the outer spray arc.

Further, the configuration of wheel 405 helps minimize the areas of the wheel that are subject to over-spray. And, keeping the spray areas of the wheel free from screws, bolts, or other small design features that may trap the sprayed material, leads to much simpler removal of unwanted over-spray between coating runs. In the most preferred embodiments for a thermal-spray process, wheel 405 surfaces and/or mounting support structures surfaces that are subject to the thermal-spray process are hard anodized to protect them from the extreme environment of repetitive sprays.

Figure 5A:
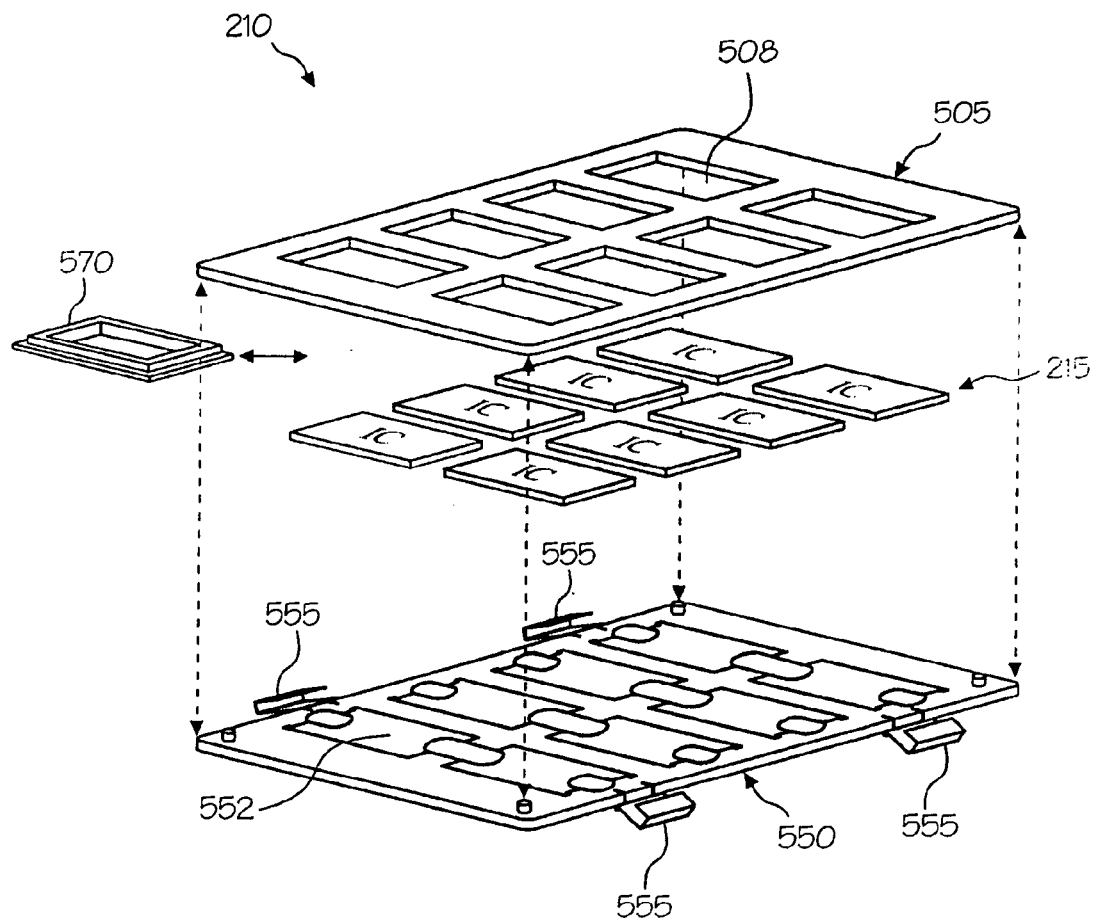
FIGS. 5A-5C illustrate a device-holding fixture for use in a spray-coating process according to an embodiment of the present invention.

Turning to FIG. 5A, a device-holding fixture 210 according to one embodiment of the present invention includes a mask plate 505 and a receptacle plate 550. Mask plate 505 and receptacle plate 550 fit together to enclose one or more parts 215 to be coated. Mask 505 includes one or more windows 508 that serve to expose a surface of part 215 to a sprayed material when fixture 210 is mounted on a target system (e.g., 200; FIG. 3A) and sprayed. Receptacle plate 550 preferably includes one or more part-alignment components 552 to assist in aligning part 215 at a window of mask plate 505 when part 215 is enclosed therein. Part alignment components 552 may be any holes, pins, depressions, ridges or other components that serve to guide and/or maintain parts 215 within fixture 210. In preferred embodiments of the invention, mask plate 505 is machined from brass and receptacle plate 550 is machined from plate aluminum.

Mask plate 505 and receptacle plate 550 may be temporarily held together for coating part 215 using any type of fastener 555 or fasteners which may facilitate at least temporary adherence of plate 505 to plate 550. In preferred embodiments fasteners 555 are of the type that do not require separate threaded fasteners such as clipping or snap-type fasteners.

In the most preferred embodiments, fasteners 555 are one or more spring clips attached to one of either mask plate 505 or receptacle place 550 while the opposite plate preferably has corresponding lock grooves for receiving the spring clips 555 in a locked position. An alternative enclosure technique could include hinging mask plate 505 and receptacle plate 550 on one side and including a fastener 555 on one or more other sides.

Figure 5B:
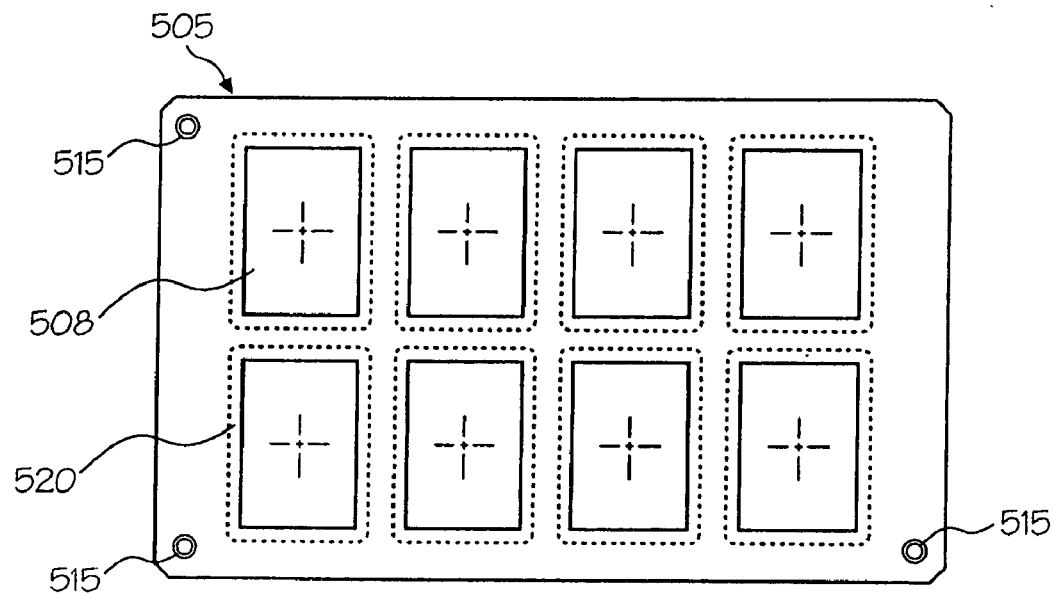
Figure 5C:
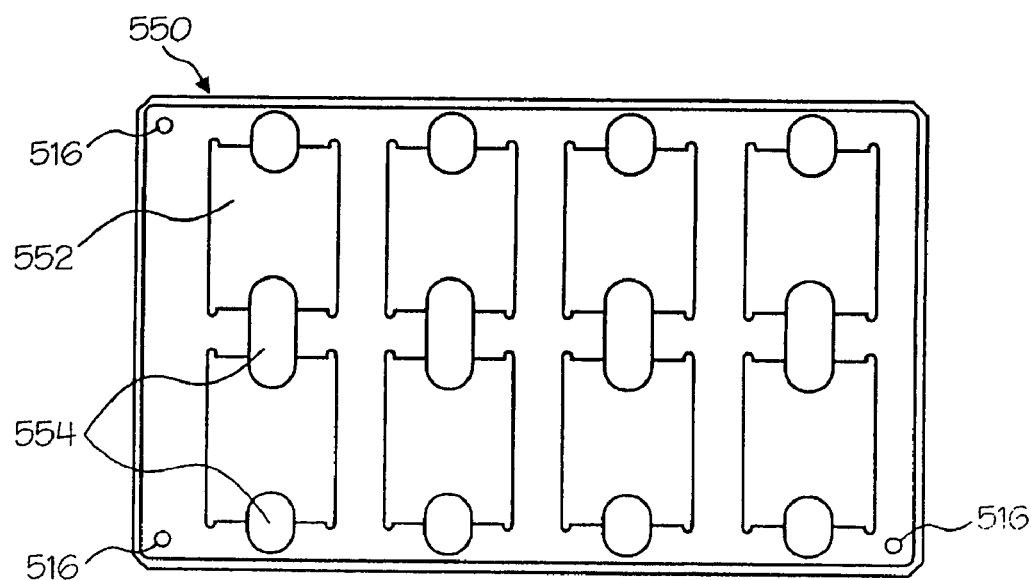

Referring to FIGS. 5B and 5C, mask plate 505 preferably includes, and receptacle plate 550 has corresponding, alignment components 515, 516 such as ridges, pins and/or holes to assist in aligning mask plate 505 with receptacle plate 550.

Mask plate 505 and/or receptacle plate 550 may also include on an interior portion thereof, a sealing structure (not shown) for sealing edges of parts 215 that are to be coated from edges of parts 215 that are not desired to having coating applied. Seals may also facilitate gentle clamping of parts 215 between plates 505 and 550 and/or protect part 215 components from exposure to vapor or other environmental factors. These seals may be any component or combination of components to achieve these functions, for example, ridges machined around windows 508 and corresponding flexible material inserted therein. In a preferred embodiment, a closed cell, solvent-resistant compliant material is added to the receptacle plate 550 underneath the devices 215. The compliant material is compressed onto the back of, for example, the product substrates when the mask plate 505 is attached, thereby forming a seal. The seal protects the ball pads, if any, or other device components located on the back of the substrate of parts 215 from heat and/or vapor that may form during processing as described below. Protection of ball pads from contamination reduces the chance of problems with attachment of solder balls during subsequent processing.

The inside edge of mask plate 505 preferably includes a window bevel and an undercut bottom 520. The window bevel helps coating material 1006 reach the edges of parts 215 when a spray gun (e.g., torch 160 FIG. 3A) is at an angle to a surface of parts 215. The undercut bottom 520 promotes the formation of a natural break between the spray on the mask plate 505 and the spray on the device 215. This enables the mask to easily lift off devices 215 after a spray coating has been applied. Undercut bottom 520 prevents bridging of coating material 1006 between the mask plate 505 and substrates of parts 215 which makes it easier to remove mask plate 505 and prevent pulling applied coating off of part 215.

As shown in the example embodiment depicted in FIG. 5C, receptacle plate 550 may include one or more receptacles 552 for receiving a part and/or one or more corresponding part access depressions 554. Depressions 554 facilitate easier removal of parts 215 from respective receptacles 552.

Figure 6:
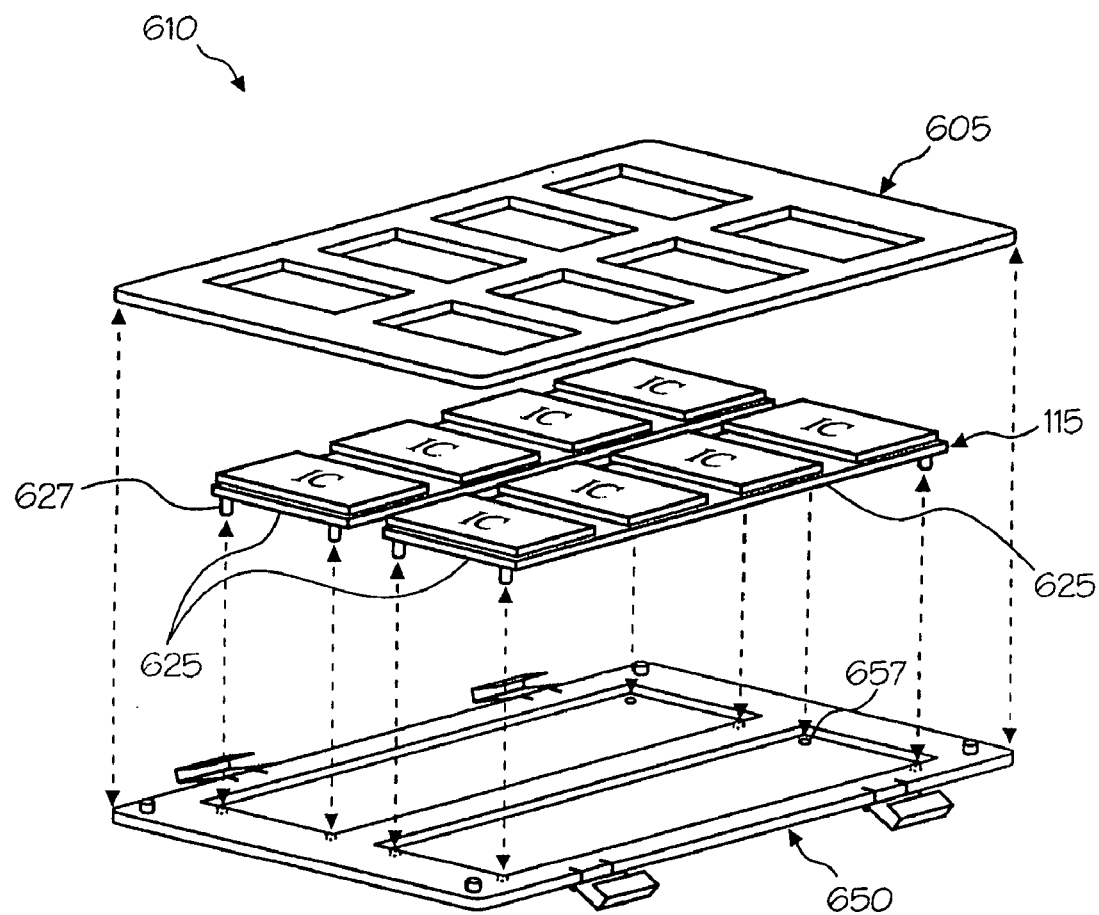
FIG. 6 illustrates a device-holding fixture for use in a spray-coating process according to an embodiment of the present invention.

Turning to FIG. 6, an alternate embodiment of part-holding fixtures 610 includes mask plate 605 and receptacle plate 650. In this embodiment, mask plate 605 and receptacle plate 650 are configured to accommodate and enclose one or more device-handling strips 625 which contain the parts to be coated 215. Device-handling strips 625 may be used in other stages of device processing and are commonly used in the semiconductor device industry to reduce handling of parts 215 by hand between and during processing. However, device-handling strips have not been previously used in a spray-coating process or in association with more expensive semiconductor devices such a multichip modules.

In one embodiment, part-holding fixture 605 is configured to accommodate two standard handling strips (which accommodate 5-6 devices each) between mask plate 605 and receptacle plate 650 using respective alignment components 627, 657 such as ridges, pins, holes and/or a combination thereof. Mask plate 605 and receptacle plate 650 are preferably held together using fasteners similar to those previously discussed, for example, spring clips. The use of strips 625 in a thermal-spray process reduces the need for operators to handle individual parts. This saves time and more importantly increases the yield of TRC-coated devices since even experienced operators can easily damage wire-bonded parts when handled outside of strips 625. The accommodation of strips 625 in device-holding fixture 610 has significant advantages over fixtures designed to accommodate only individual parts.

Using part-holding fixtures 210, 610 of the present invention, spray coatings may be applied to parts 215 in a rapid and efficient manner and preferably, with reduced handling of parts 215. Device-holding fixtures 210, 610 may also be used for applying a primer coating (e.g., such as discussed by Heffner et al.) in preparation for application of a thermal spray. Application of the primer coating in one embodiment of the invention is performed using a system other than that shown and described in reference to FIG. 3A. In one embodiment, an automated primer-coating machine with conveyor is used to apply the primer to the surface of device 215.

To this end, fixtures 210, 610 may be individually placed on the conveyor for priming. However, turning to FIGS. 7A and 7b, in another embodiment of the present invention, a pallet 700 is designed to accommodate multiple device-holding fixtures 210, 610 for application of a primer coating. Pallet 700 is preferably made of an aluminum material and configured to fit the conveyor of an existing automated coating machine, such as a Nordson Easycoat machine. However, using pallet 700 two part-holding fixtures may be accommodated for each run through the machine for automated application of the primer coating. Pallet 700 is dimensioned and configured to ride on the machine's conveyor into the automated priming cell. The setup time required to program the automated primer machine may be greatly reduced with pallet 700 and fixtures 210, 610 because parts 215 are regularly spaced at predefined intervals and oriented at square angles to the motion axes of the primer spray nozzle.

In preferred embodiments, device-holding fixtures 210, 610 are substantially rectangular in shape with devices 215 placed at regular intervals across the fixture. However the shape of fixtures 210, 610 and the configuration of windows therein is not critical. The shape and layout of fixtures 210, 610 may be modified as suitably necessary. Notwithstanding, the predefined shape, size and window configuration of fixtures 210, 610 aid in determining predictable results. In any event, according to preferred embodiments of the invention, the same device-holding fixtures 210, 610 are configured so that they may be used for both the application of a primer in an automated primer machine and the application of the thermal-spray coating.

Certain parts 215 may include a metallic ring of material for sealing an integrated circuit device. Such devices, for example, certain flatpack devices, often require coating without contaminating the devices in the areas outside of the seal ring or the top surface of the seal ring. Coating material 1006 that contaminates these surfaces could interfere with electrical connections or next-step sealing operations.

For parts 215 that include seal rings, fixtures 210, 610 are adapted to conform to the same general shape and thickness of the parts 215 and may include inserts (570; FIG. 5A) that fit over the seal ring of each device 215. Insert 570 serves as a sleeve to further define the mask window for coating device 215. Insert 570 preferably includes a thin lip that fits tightly inside the seal ring. Window 508 is dimensioned to permit a loose fit with insert 570 such that insert 570 has freedom of movement to accommodate typical variations found in ring placement when constructing part 215. This allows for the same fixture design to accommodate the typical variations found in various types of devices 215 with a wide size-tolerance and without having any impact on a defined spray area.

Inserts 570 are preferably made of an aluminum material and configured with a lip that fits inside the device seal ring to prevent unwanted build-up of thermal-spray material on the walls of the seal ring. The lip of the insert may also serve to lock the position of the insert on top of the seal ring. The inserts also preferably include compliant material, e.g., similar to the material for seals discussed above, on the surfaces of the insert that contact the mask, receptacle plate and/or device. The compliant material promotes the application of gentle clamping pressure between the mask plate 505, 605 and receptacle plate 550, 650 on the device 215 and the insert. Without the compliant material, the tolerance variation typical in, for example, ceramic devices may result in loosely clamped assemblies that are subject to movement during the thermal-spray process. The compliant material on the insert also facilities a seal around the seal ring of device 215 to protect the sides, bottom and leads from contamination by a coating material 1006 such as primer or thermal-spray coating.

Figure 8:
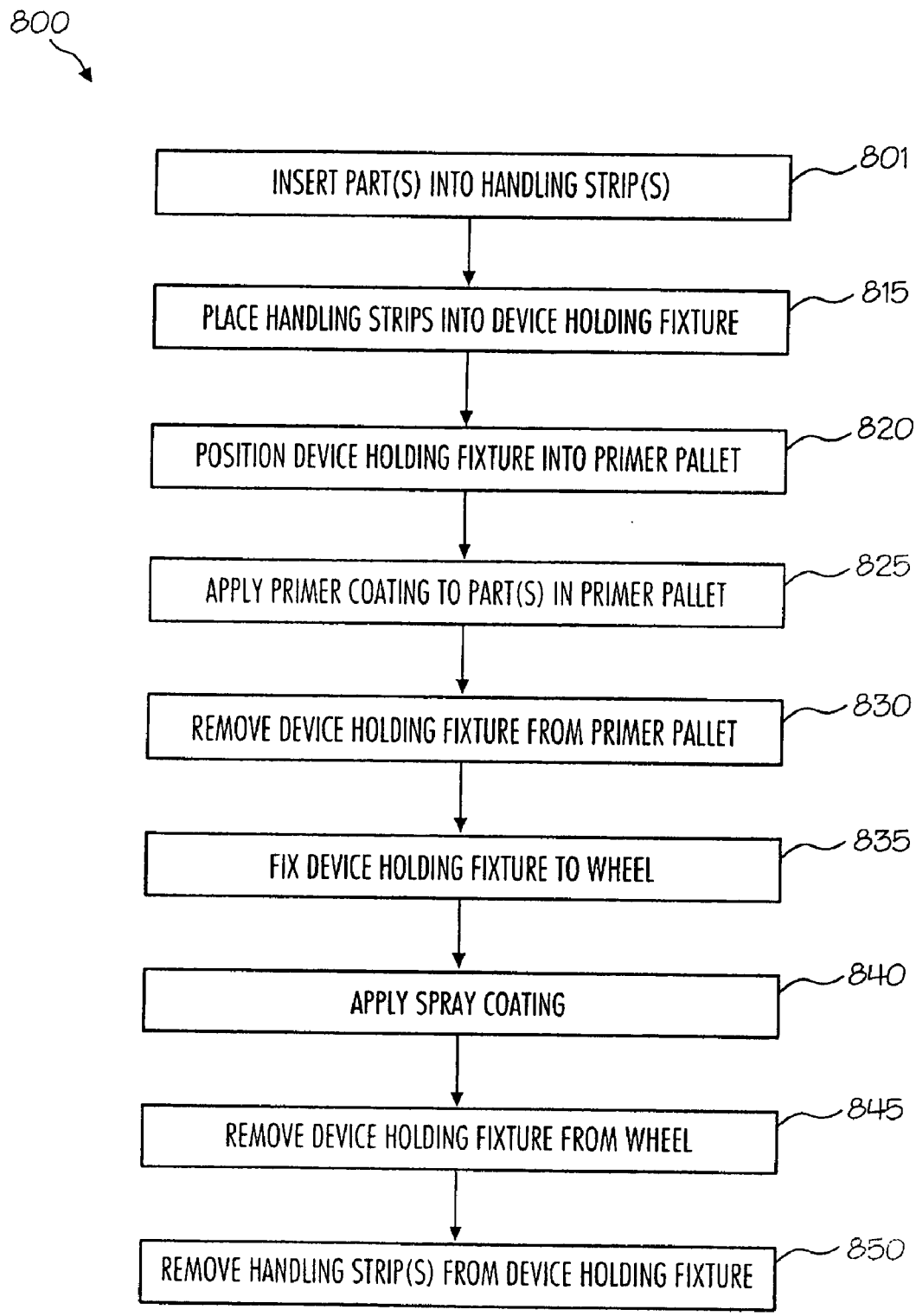
FIG. 8 is a flow diagram illustrating a method of applying a spray coating according to an embodiment of the present invention.

Turning to FIG. 8, a method 800 for applying a spray coating to parts using the apparatuses and systems of the present invention includes placing 815 the part or parts desired to be coated into a device-holding fixture, fixing 835 the device-holding fixture to a target spray wheel, applying 840 a spray coating to the device-holding fixture fixed on the wheel, removing 845 the part-holding fixture from the wheel, and, if appropriate, removing 850 the parts from the part-holding fixture. In an optional embodiment, the method includes corresponding steps for the use of part handling strips (e.g., actions 801 and 850).

Moreover, if the spray coating is a thermally sprayed material, after placing 815 the parts into the device-holding fixture, method 800 may further include positioning 820 the device-holding fixture into an accommodating pallet in an automated primer-coating machine, applying 825 a primer coating to parts in the primer pallet and removing 830 the device-holding fixture from the primer pallet. After coating parts in a device-holding fixture with a primer coating, it is preferable to clean or replace the mask portion of the device-holding fixture before proceeding to apply a thermal-spray coating.

Placing 815 parts into a device-holding fixture may include placing an insert around a part and enclosing the part and respective insert between two halves of the device-holding fixture. Additional actions such as plasma cleaning steps and/or drying may be included in method 800 although not separately discussed herein.

Figure 9:
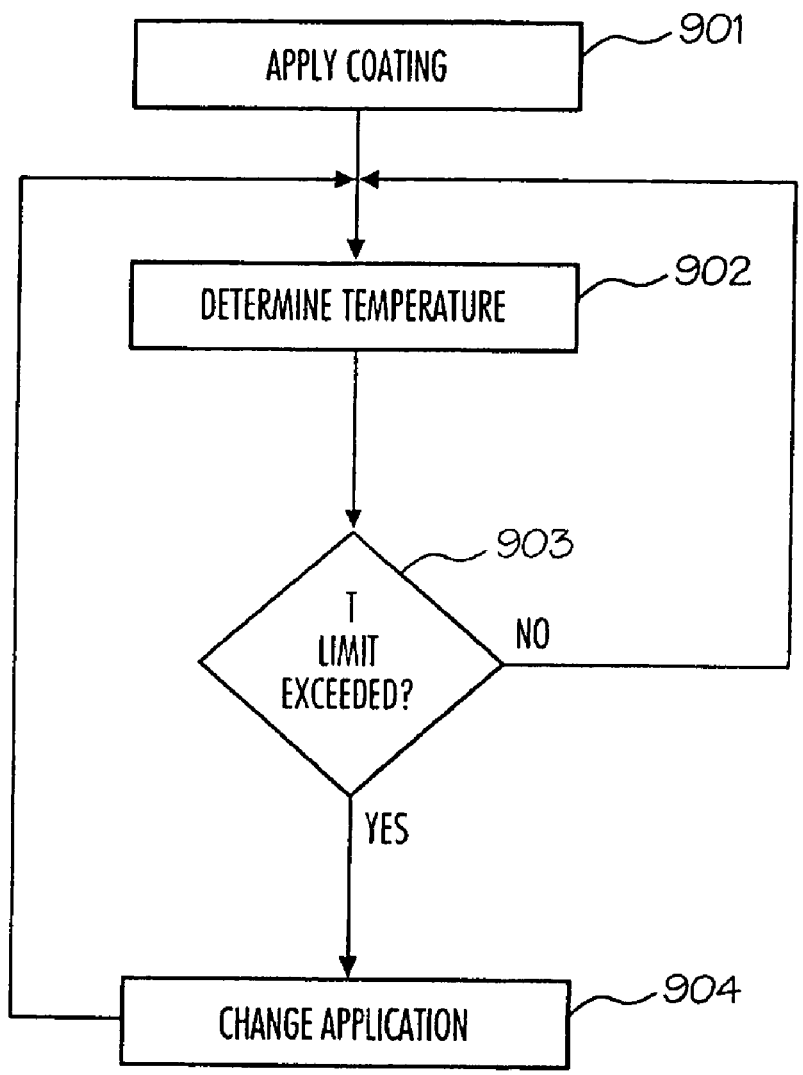
FIG. 9 is a flow diagram illustrating a method for building a TRC according to an embodiment of the present invention.

FIG. 9 is a flow diagram illustrating a method for building a TRC according to an embodiment of the invention. The method is described below in the exemplary context of being performed by system 100, as shown in FIG. 3A, however, the description does not restrict performance of the method to system 100, as other systems may be employed.

At step 901, coating material 1006 may be applied over a surface to build the TRC. Any structure suitable for performing step 901 may be utilized. In the context of system 100, however, control system 110 may execute instructions in accordance with step 901 to control spray-coating mechanism 150 and/or spray-target system 200.

Concerning coating material 1006, any coating material may be used that is suitable for building a TRC. Moreover, coating material 1006 may be produced by heating a solid material to form coating material 1006.

Figure 11:
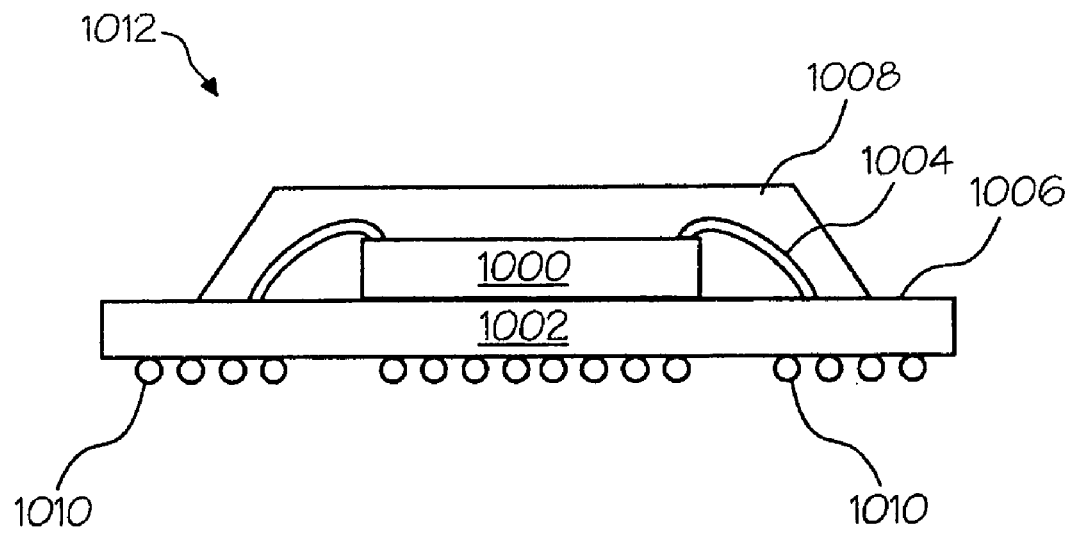
FIG. 11 is a simplified cross-sectional view of an integrated circuit package having a surface upon which a TRC is built according to an embodiment of the present invention.

Concerning the surface over which the TRC may be built, the surface may generally comprise any surface of any object. Such objects may include any object over which it may be desirable to have a physical barrier to prevent inspection of and/or tampering with the surface underlying the physical barrier or anything below such surface. Examples of such objects may include part or product 215, as shown in FIGS. 3A, 3B, 5A, 6 and 7A, as well as an integrated circuit package 1012 and/or any of its components, as shown in FIG. 11.

The components of integrated circuit package 1012 may include an integrated circuit 1000, a substrate 1002, interconnects 1004 between substrate 1002 and integrated circuit 1000, coating material 1006, an encapsulant 1008 and package contacts 1010. Package 1012 may house, in place of or in addition to one or more integrated circuits 1000, one or more discrete electronic devices (not shown). While integrated circuit package 1012 is shown as a ball grid array package with wire bonds for interconnects 1004 and solder balls for package contacts 1010, any type of integrated circuit package and package components may include surfaces over which it may be desirable to have built a TRC. As shown in FIG. 11, coating material 1006 may cover a surface of substrate 1002 and/or a surface of integrated circuit 1000 and interconnects 1004. A primer coating may be applied prior to application of coating material 1006, while encapsulant 1008 may be applied following application of coating material 1006.

Concerning the application of coating material 1006, thermal-spray gun 160 may contribute to the application by spraying coating material 1006 over a surface of one or more objects-under-process, such as parts 215 or one or more components of package 1012, to build a TRC. While spraying may contribute to the application of coating material 1006, other factors may also contribute to the application, including: 1) moving the gun's spray relative to the surface of the objects-under-process by, for example, the spray-gun mounting system 180; 2) moving the objects-under-process relative to the gun's spray by, for example, rotating wheel 205 with a wheel-speed controller (not shown); 3) varying one or more parameters affecting the gun's spray, such as the feed rate of one or more inputs to gun 160; 4) changing the heating of the surface of the objects-under-process by, for example, employing a supplemental heater, e.g., a radiant heating system 202; 5) changing the cooling of the surface of the objects-under-process by, for example, employing a supplemental cooler, e.g., forced-fluid cooling system 203; and/or 6) any other factor that those skilled in the art may consider as contributing to the application of coating material 1006 over a surface to build a TRC.

At step 902, a temperature related to the process may be determined. The temperature may comprise any temperature of any structure or surrounding environment of system 100 taken at any time of a processing run. The temperature may comprise a temperature of any one or more objects-under-process, such as parts 215, integrated circuit packages 1012 or any components thereof.

Any structure suitable for performing step 902 may be utilized. In the context of system 100, however, control system 110 may execute instructions in accordance with step 902 to determine temperature represented by signals provided from temperature sensor 201. In a variation, temperature may be measured and determined by temperature sensor 201, which may provide appropriate signals to control system 110 for further use.

Temperature sensor 201 may comprise a non-contact temperature sensor, one not requiring physical contact with the object whose temperature is being measured. Examples of non-contact temperature sensors may include infrared temperature sensors, infrared thermometers, radiation thermometers, infrared pyrometers, spot thermometers, spot radiometers, line scanners, radiation pyrometers, single-waveband pyrometers, dual-waveband pyrometers, ratio pyrometers, two-color thermometers, two-color pyrometers, radiometers, spectral radiometers, infrared thermocouples, total radiation pyrometers, fiber optic pyrometers, disappearing filament pyrometers, quantitative thermal imagers, disappearing filament optical pyrometers (DSPs), optical pyros, multi-wavelength pyrometers and the like.

In one embodiment, temperature sensor 201 may comprise a non-contact infrared temperature sensor, such as the Thermalert CI3A or the Thermalert CI3B, each manufactured by Raytek Corporation of Santa Cruz, Calif. Non-contact infrared temperature sensors may absorb ambient infrared radiation given off by a heated surface. The incoming light may be converted to an electric signal, which may correspond to a particular temperature.

Temperature sensor 201 may be mounted to a structure (not shown) to permit temperature sensor 201 to monitor an area of interest. The area of interest may include any desired portions of target-wheel 205, for example, those that may contain the objects-under-process, such as parts 215, integrated circuit packages 1012 or any components thereof, as they rotate on target-wheel 205. The objects-under-process may emanate energy representative of their temperature as they rotate on target-wheel 205. Similarly, heated portions of target-wheel 205 within the field-of-view of temperature sensor 201 may also emanate energy representative of their temperature as target-wheel 205 rotates. Temperature sensor 201 may sample such energy and provide corresponding signals to control system 110 for further use, such energy-sampling and/or signal-providing occurring continuously or periodically. When the area of interest comprises a ring-like circumferential region of target-wheel 205 that includes the objects-under-process, temperature sensor 201 may receive energy representing temperatures of the objects-under-process as well as of the target-wheel regions between such objects. Consequently, temperature sensor 201 may provide signals to control system 110 representing an approximation of temperature for one or more of the objects-under-process.

At step 903, a determination may be made to see if compensating action is desired. Any structure suitable for performing step 903 may be utilized. In the context of system 100, however, control system 110 may execute instructions in accordance with step 903 to make the determination. The determination may be based on the signals provided by temperature sensor 201 and may use to make the determination any standard, such as a standard related to temperature. Exemplary standards may include whether a minimum limit or a maximum limit has been exceeded for temperature, or for any time rate of change of temperature. If no standard is exceeded, the process returns to step 902, however, if a standard is exceeded, the process moves to step 904.

At step 904, a change may be made to in any manner control the application process. Any structure suitable for performing step 904 may be utilized. In the context of system 100, however, control system 110 may execute instructions in accordance with step 904 to control spray-coating mechanism 150 and/or spray-target system 200 to appropriately control the application process.

Controlling the application process may include: 1) moving the gun's spray relative to the surface of the objects-under-process by, for example, the spray-gun mounting system 180; 2) moving the objects-under-process relative to the gun's spray by, for example, rotating wheel 205 with a wheel-speed controller (not shown); 3) varying the gun's spray or varying one or more parameters affecting the gun's spray, such as the feed rate of one or more inputs to gun 160; 4) changing the heating of the surface of the objects-under-process by, for example, employing a supplemental heater, e.g., a radiant heating system 202; 5) changing the cooling of the surface of the objects-under-process by, for example, employing a supplemental cooler, e.g., forced-fluid cooling system 203; and/or 6) any other factor that those skilled in the art may consider as contributing to the application of coating material 1006 over a surface to build a TRC.

In one embodiment, control system 110 may direct a wheel-speed controller (not shown) to control the rotational velocity of target-wheel 205. For example, if a determined temperature, such as for one or more objects-under-process, rises above a target temperature, e.g., $T_{tgt}$ in FIG. 10, by a predefined amount, wheel-speed controller may increase by a predefined amount the rotational velocity of target-wheel 205, which should reduce subsequently-determined temperatures. Conversely, if a determined temperature, such as for one or more objects-under-process, falls below a target temperature, e.g., $T_{tgt}$ in FIG. 10, by a predefined amount, wheel-speed controller may decrease by a predefined amount the rotational velocity of target-wheel 205, which should increase subsequently-determined temperatures. Consequently, a determined temperature, such as for one or more objects-under-process, may be controlled during the building of a TRC.

Figure 10:
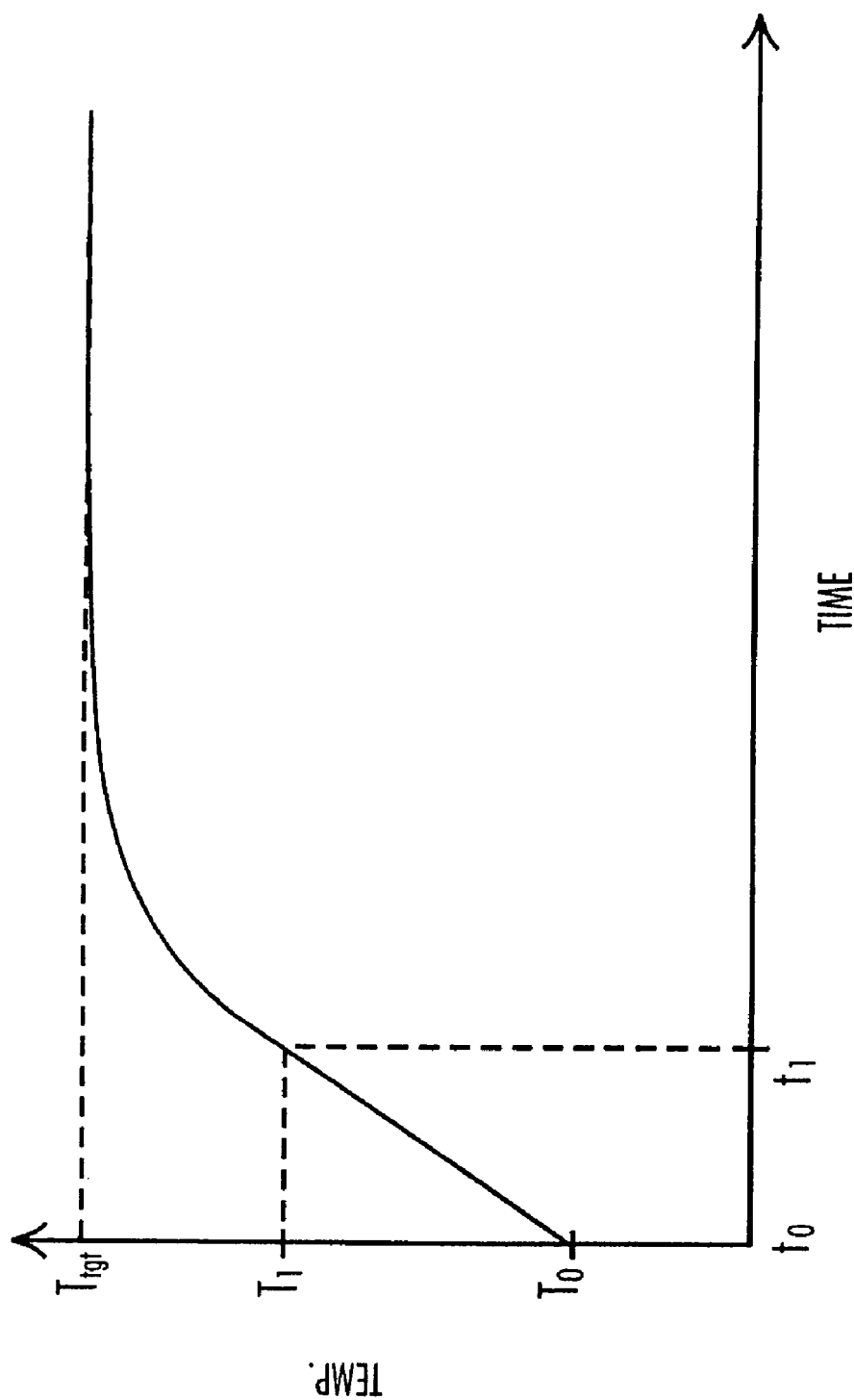
FIG. 10 is a graph illustrating a warm-up to a desired temperature for building a TRC according to an embodiment of the present invention.

FIG. 10 is a graph illustrating a warm-up to a desired temperature for building a TRC. In the graph, time is represented across the X-axis and temperature, as may be determined from signals provided by temperature sensor 201, is represented along the Y-axis.

At time $t_0$, temperature $T_0$ may represent the initial temperature for the process. The initial temperature $T_0$ may represent the initial temperature of the environment, e.g., room temperature in which the process takes place. At time $t_0$, control system 110 may direct a wheel-speed controller (not shown) to ramp-up the rotational velocity of target-wheel 205 to a predefined speed in the range of 100-500 revolutions per minute (RPM), with a preferred speed in the range of 200-350 RPM, and may direct thermal-spray gun 160 to apply heat in a predefined temperature range of 70-85 degrees Celsius, with a preferred temperature of 75 degrees Celsius. In this manner, the determined temperature may rapidly reach and/or rise above a predefined temperature range of 70-85 degrees Celsius, representing a minimum temperature range at and/or above which control system 110 may direct thermal-spray gun 160 to begin spraying coating material 1006, with a preferred temperature $T_1$ of 75 degrees Celsius. It may take approximately 10 to 30 second to reach this temperature range.

After the determined temperature, such as for one or more objects-under-process, has reached and/or exceeded a temperature within the minimum temperature range of 70-85 degrees Celsius for spraying coating material 1006, such as temperature $T_1$ 75 degrees Celsius, control system 110 may direct thermal-spray gun 160 to begin spraying coating material 1006. Additionally, control system 110 may direct the control of a wheel-speed controller as described above, to vary the rotational velocity of target-wheel 205 such that the determined temperature may reach and maintain, with a predefined tolerance, a target temperature within a range of 90-135 degrees Celsius, with a preferred temperature $T_{tgt}$ of 95 degrees Celsius. For the target temperature range of 90-135 degrees Celsius and the preferred target temperature $T_{tgt}$ of 95 degrees Celsius, the corresponding range and preferred rotational velocity of target-wheel 205 may be 100-300 RPM and 250 RPM. Those skilled in the art understand that when the determined temperature initially reaches, and subsequently maintains, the target temperature $T_{tgt}$, the determined temperature may oscillate or "hunt," i.e., rise above and fall below the target temperature $T_{tgt}$ within predefined controllable boundaries.

Unless contrary to physical possibility, the inventors envision the methods and systems described herein: (i) may be performed in any sequence and/or combination, and (ii) the components of respective embodiments combined in any manner.

Although there have been described preferred embodiments of this novel invention, many variations and modifications are possible and the embodiments described herein are not limited by the specific disclosure above, but rather should be limited only by the scope of the appended claims.

For example, while the applying of coating material 1006 may be based on temperature, the application may be similarly based on other thermal parameters, such as heat or any type of energy.

The invention claimed is:

1. A system for building a tamper resistant coating, comprising:
   a spray mechanism for spraying a coating material;
   a target system including a rotatable spray-target that retains an object with a surface to be covered by the tamper resistant coating;
   a temperature sensor for monitoring a temperature related to an area of interest of a spraying environment, wherein the area of interest includes at least a portion of the rotatable spray target; and
   a control system for controlling application of the coating material based on the temperature that is determined during the spraying.

2. The system of claim 1 wherein the application comprises thermal spraying.

3. The system of claim 1 wherein the application comprises moving the surface across a spray of the coating material.

4. The system of claim 1 wherein the application comprises moving a spray of the coating material across the surface.

5. The system of claim 1 wherein the application comprises controlling relative motion between a spray of the coating material and the surface.

6. The system of claim 1 wherein the application comprises controlling relative speed of motion between a spray of the coating material and the surface.

7. The system of claim 6 wherein the relative speed of motion is changed by a wheel-speed controller.

8. The system of claim 1 wherein the application comprises controlling cooling of the surface.

9. The system of claim 8 wherein the cooling is changed by a forced-fluid cooling system.

10. The system of claim 9 wherein the fluid comprises a gas.

11. The system of claim 1 wherein the application comprises controlling heating of the surface.

12. The system of claim 11 wherein the heating is changed by a radiant heating system.

13. The system of claim 1 wherein the object comprises at least one of a substrate, an integrated circuit, an interconnect between the substrate and the integrated circuit, an integrated circuit package, and a primer coating.

14. The system of claim 1 wherein the temperature sensor comprises a non-contact sensor.

15. The system of claim 1 wherein the temperature sensor comprises a non-contact infrared sensor.

16. The system of claim 1 wherein the temperature comprises a temperature of the surface.

17. The system of claim 16 wherein the surface comprises a portion of at least one of a substrate, an integrated circuit, an interconnect between the substrate and the integrated circuit, an integrated circuit package, and a primer coating.

18. The system of claim 1 wherein the temperature is periodically measured and determined.

19. The system of claim 1, wherein the rotatable spray target comprises a substantially circular wheel having a circumference.

20. The system of claim 19, wherein the area of interest comprises a region about the circumference of the spray target.

* * * * *